(12) United States Patent
Murray Clube

(10) Patent No.: US 6,226,110 B1
(45) Date of Patent: *May 1, 2001

(54) METHOD AND APPARATUS FOR HOLOGRAPHICALLY RECORDING AN ESSENTIALLY PERIODIC PATTERN

(75) Inventor: Francis Stace Murray Clube, Neuchatel (CH)

(73) Assignee: Holtronic Technologies Ltd., Marin (CH)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/808,999

(22) Filed: Mar. 3, 1997

(30) Foreign Application Priority Data

Mar. 12, 1996 (GB) .................................... 9605235

(51) Int. Cl.$^7$ .............................. G03H 1/02; G03H 1/20
(52) U.S. Cl. .................................. 359/28; 359/12; 359/1
(58) Field of Search ........................... 359/10, 12, 11, 359/21, 22, 24, 28, 35

(56) References Cited

U.S. PATENT DOCUMENTS

| | | | |
|---|---|---|---|
| 4,806,442 | * | 2/1989 | Shirasaki et al. ............. 359/566 |
| 4,857,425 | * | 8/1989 | Phillips ........................... 359/10 |
| 5,528,390 | * | 6/1996 | Goto et al. ..................... 359/12 |
| 5,626,991 | * | 5/1997 | Hugle ............................. 359/12 |
| 5,781,317 | * | 7/1998 | Kawazoe et al. ............. 359/12 |
| 5,783,319 | * | 7/1998 | Reisfeld et al. .............. 428/690 |

* cited by examiner

Primary Examiner—Cassandra Spyrou
Assistant Examiner—Jared Treas
(74) Attorney, Agent, or Firm—Leo Stanger

(57) ABSTRACT

The present invention relates to a method and an apparatus for holographically recording periodic or quasi-periodic features of a mask in a holographic recording layer. In holographic lithography the object beam is directed to the first substrate bearing a holographic recording layer such that it passes the mask substrate and interferes with a reference beam in the recording layer to form a hologram of the mask pattern. According to the new method the object beam is directed to the second substrate at an off-axis angle and the wavelength used and/or the angle of incidence of the object beam are selected according to the period of the features to be recorded such that essentially just the zero and one of the first diffraction orders are present for forming the hologram.

16 Claims, 4 Drawing Sheets

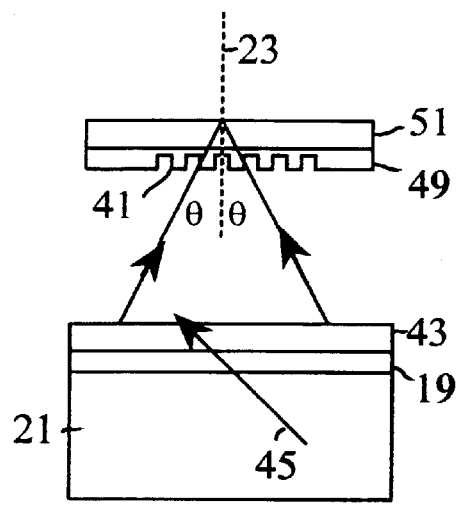 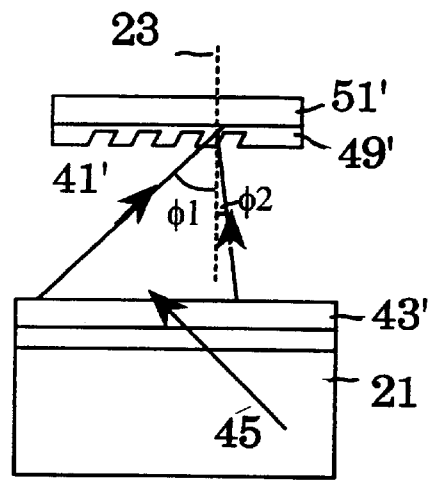
Fig. 4a  Fig 4b
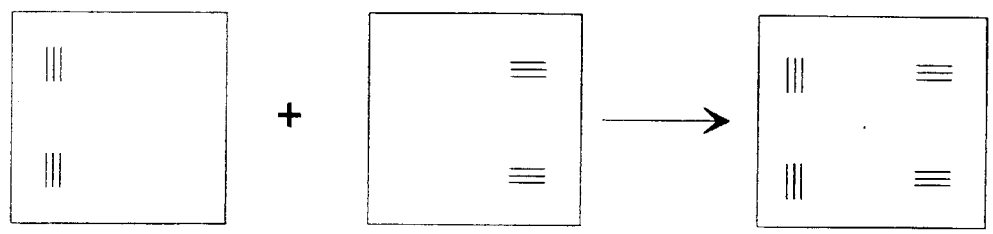
Fig. 5
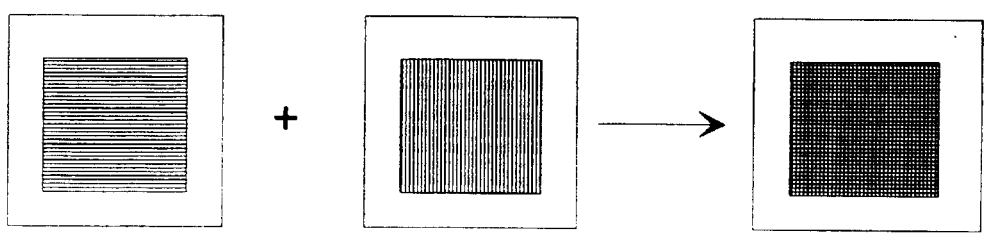
Fig. 6

METHOD AND APPARATUS FOR HOLOGRAPHICALLY RECORDING AN ESSENTIALLY PERIODIC PATTERN

The present invention relates to a method and an apparatus for holographically recording periodic or quasi-periodic features of a mask in a holographic recording layer.

U.S. Pat. No. 4,857,425 discloses a method for the manufacture of integrated circuits using Total Internal Reflection (TIR) holography. The disclosed TIR holographic technique is characterized in that a first substrate bearing a holographic recording layer is disposed on the hypothenuse face of a prism and a second substrate containing e.g. an integrated circuit pattern is arranged in proximity to the first substrate. The distance between the first and the second substrate is usually about 100 microns. In a first step the pattern of the integrated circuit is holographically recorded in the holographic recording layer of the first substrate by illuminating said photosensitive layer with an object and a reference beam of mutually coherent light, the object beam passing through the mask window and being incident on the holographic layer at 90 degree, and the reference beam being projected through one of the shorter faces of the prism at such an angle that the light is totally internally reflected off the photosensitive layer/air interface. The interference between the object and the reference beams is recorded in the photosensitive layer which after proper development and fixation presents the hologram.

For the reconstruction the hologram is again contacted with the prism face and the second substrate is replaced e.g. by a silicon wafer bearing a photosensitive layer. Thereafter a so-called reconstruction beam is directed through the prism in the exactly reversed direction to the reference beam used for the hologram recording. For this purpose, in practice, the hologram often is turned by 180° so that the reference beam functions as reconstruction beam. The reconstruction beam produces a positive image of the circuit pattern in the photosensitive layer of the silicon wafer.

Although the holographic system of Philips allows recording of features in the submicron level the attainable practical resolution in some cases is still not high enough for certain applications, e.g. for manufacturing so-called Distributed FeedBack Lasers (DFB-lasers). Their fabrication requires the formation of a fine period grating in the order of approximately 0.2 $\mu$m on a substrate material. At present the manufacturers of DFB-lasers use electron-beam lithography to "write" the grating lines. This is a slow process and therefore very expensive and not commercially attractive for large production quantities.

A general problem of high resolution lithography is the restricted depth of focus of the imaged patterns. In holographic lithography it is therefore necessary that the separation between hologram and wafer in the hologram reconstruction step is the same as the separation between recording layer and mask in the hologram recording step. Means are therefore provided which allow measurement and adjustment between the mask and the recording layer during hologram recording and between hologram and wafer during hologram reproduction step (see e.g. U.S. Pat. No. 4,857,425 issued to Philipps).

An object of the present invention is to overcome the shortcomings of the prior art and, in particular, to provide a method and an apparatus for holographically recording an essentially periodic pattern of features with still better resolution in a holographic recording layer.

According to the invention the method comprises the following steps:

- optically contacting a first substrate bearing a holographic recording layer to one face of a prism;
- disposing a second substrate bearing a first mask pattern parallel and in proximity to the first substrate, the mask pattern containing periodic or quasi-periodic features in a first direction;
- splitting and expanding or vice versa a light beam of a certain wavelength to generate an object beam and a reference beam
- directing the reference beam to one of the remaining prism faces such that the reference light beam is totally internally reflected off the holographic recording layer/air interface and
- directing the object beam to the first substrate such that it passes the mask pattern and interferes with the reference beam in the holographic recording layer to form a hologram of the mask pattern, wherein the object beam is directed to the second substrate at an off-axis angle and the wavelength used and/or the angle of incidence of the object beam are selected according to the period of the features to be recorded such that essentially just the zero and one of the first diffraction orders are present for forming the hologram.

It has been found that by using such off-axis object beam illumination the resolution capability by TIR holographic lithography can be significantly improved provided that the mask pattern comprises essentially periodic or quasi-periodic features. The theoretical limit to the smallest period which can be recorded can be as small as $\cong \lambda/2$ in contrast to the conventional holographic technique where the smallest theoretically attainable period is $\lambda$. In addition to this resolution advantage, since there are only two propagating diffraction orders of light, the depth of focus is significantly increased in comparison with a conventional TIR hologram recording arrangement in which the object beam is normal to the plane of the mask.

A quasi-periodic mask pattern is a pattern having a limited bandwith of spatial frequencies (e.g. +/−10% of the average spatial frequency) in contrast to a pattern having a precise or discrete period. Such a quasi-periodic mask pattern may comprise a sequence of grating segments each with a precise (and the same) period but offset with respect to each other by some fraction of the grating period. This is commonly the case for DFB Lasers.

Advantageously, the object beam is directed to the first substrate at an angle such that the normal to the plane of the first substrate essentially bisects the directions of the zero and first diffraction orders. In this manner the structures which will be formed upon illumination of the hologram in the photosensitive layer on a wafer or the like, will have essentially perpendicular sidewalls with respect to the plane of the wafer. This can be of importance for subsequent processing of the wafer.

According to an advantageous embodiment the plane of incidence of the object beam on the second substrate or mask contains the vector describing the direction of the periodicity, i.e. if the periodic features are lines in a grating, the object beam is essentially orthogonal to the grating lines. In this way the contrast the interference of the optical interference pattern recorded in the holographic layer can be maximised.

Different modifications of the inventive method are feasible. For instance, after recording a hologram according to the above method it is possible to rotate the second substrate containing the mask pattern with respect to the first substrate and to rotate the object beam such that the plane of incidence of the object beam again contains the direction of the periodicity and to record the mask pattern of the second substrate in the holographic recording layer a second time. By this procedure high-resolution grating structures in different directions may be recorded and subsequently printed. Instead of rotating the pattern containing second substrate, the first substrate bearing the holographic recording layer may be rotated.

If the second substrate is replaced by another substrate bearing a mask pattern containing periodic or quasi-periodic features in a second direction a hologram containing features of different periods and in different directions can be produced.

It is also possible to record the same or different mask patterns in two or more different holographic recording layers on two or more different first substrates for forming two or more holograms. The pattern recorded in these holograms can be subsequently reconstructed onto a photosensitive layer on a single substrate thereby composing a complex two-dimensional pattern, for instance a microcircuit application.

According to a particularly advantageous embodiment of the method the second substrate containing a mask pattern having periodic or quasi-periodic features in at least two essentially different directions is used and wherein the mask patterns are recorded in the holographic recording layer either by simultaneously illuminating the periodic features with at least two sets of object and reference beams, each set of object and reference beams emanating from a separate light source, where the object beams are at off-axis angles such that essentially the zero and one of the first diffraction order are generated by the respective periodic features to be recorded in the hologram or by first illuminating the periodic features in the first direction with first object and reference beams where the object beam is at an off-axis angle such that essentially the zero and one of the first diffraction order are generated by the respective periodic features to be recorded in the hologram; and then illuminating the periodic features of the second direction with second object and reference beams where the object beam is at an off-axis angle such that essentially the zero and one of the first diffraction order are generated by the second periodic features.

Preferably the plances of incidence of the object beams contain the direction of periodicity of the respective mask patterns.

The above methods allow the simultaneous or consecutive recording of two-dimensional structures without re-arranging the object beams. Preferably, also the plane of incidence of the reference beam is in the plane of incidence of the object beam. However, the method performs also well when the plane of incidence of the reference beam is not in the plane of the object beam.

The reconstruction of the holograms can be done by optically contacting the hologram—after development and fixation of the same—again with the prism face, replacing the substrate bearing the mask pattern by another substrate having a photosensitive layer and then directing the reference beam—with respect to the beam direction in the hologram recording step—in the reversed direction through the prism.

The invention relates also to a holographic recording system for working the method. The system comprises a prism a first substrate bearing a holographic recording layer and being optically contacted to one of the prism faces a second substrate being disposed parallel and in proximity to the first substrate, the second substrate bearing a mask pattern containing periodic or quasi-periodic features in a first direction, at least one light source emitting light with a certain wavelength a beam splitting and expansion optics for generating an object beam and a reference beam means for directing the reference beam to one of the remaining prism faces such that the reference beam is totally reflected off the holographic recording layer/air interface and means for directing the object beam to the first substrate such that it passes the mask pattern and interferes with the reference beam in the holographic recording layer to form a hologram of the mask pattern wherein the object beam directing means are arranged such that the object beam is directed to the second substrate at an off-axis angle and wherein the wavelength used and/or the angle of incidence of the object beam are selected according to the period of the features to be recorded such that essentially just the zero and one of the first diffraction orders are present for forming the hologram.

The above apparatus allows the recording of substantially periodic structures with higher resolution than conventional apparati in the field of holographic lithography. Further preferred embodiments of the invention are described in the sub-claims. These include e.g. means for varying the angle of incidence of the object beam so that the system can be easily adapted to the recording of features of different periods.

A particularly advantageous embodiment comprises a second light source and means for generating second object and second reference beams independent of the first object and first reference beams; and a prism allowing directing the first and the second reference beams to the first substrate at such an angle that the reference beams are reflected off the holographic recording layer/air interface.

The invention is hereinafter described with reference to the drawings, in which

FIG. 1 schematically illustrates hologram recording in a conventional TIR hologram recording system exemplified by the diffraction of a object beam by a mask pattern constituting a one-dimensional grating of a period d;

FIG. 4a and 4b illustrates schematically the problems arising if zero and first order diffracted light are not symmetrical with respect to the normal to the plane of the mask;

Figure 7:
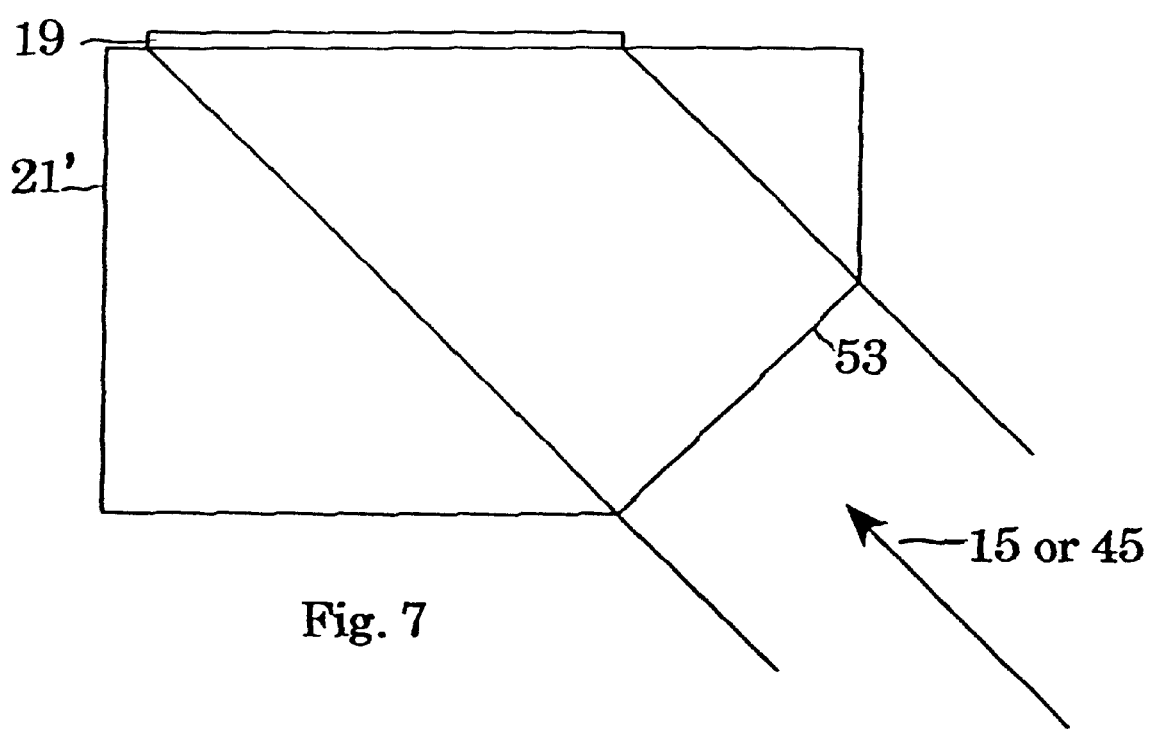

FIG. 5 principally shows how different periodic patterns of two substrates can be transferred in one hologram;

FIG. 6 principally shows how two-dimensional grating structures can be manufactured from a single pattern; and FIG. 7 shows a possible prism shape in a cross-sectional view which allows the use of two sets of object and reference beams.

Figure 1:
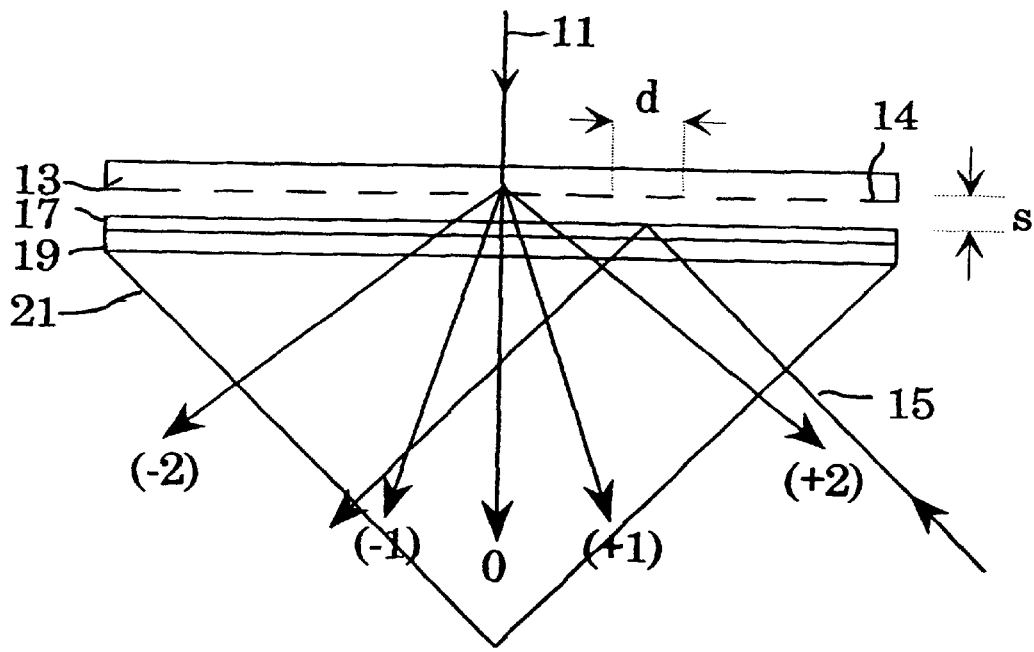

According to FIG. 1 a conventional holographic recording system comprises a prism 21, a substrate 19 bearing a holographic recording layer 17 and a second substrate 13 containing a grating pattern 14. The second substrate 13 is arranged parallel and in proximity to the first substrate 19 and is separated from the holographic recording layer by a distance s. For hologram recording a coherent light beam 11 or object beam is sent through the second substrate 13 whereby the light beam 11 is diffracted at the grating pattern 14. A reference beam 15 is directed through the prism 21 to the first substrate 19 at such an angle that it is reflected off the holographic recording layer/air interface. The interference of the diffracted orders generated by the grating pattern 14 with the reference beam 15 is recorded in the holographic layer and thereby forms a hologram.

In this example, the light beam 11 of wavelength $\lambda$ passing through the grating 13 of a period d is diffracted and produces a zero order, two first orders, (+1, −1) and two second orders (+2, −2). In the general case, the number of diffraction orders depends on the ratio of $\lambda/d$ (wavelength/ grating period).

It is well known that the angle $\theta_n$ of the nth diffraction order is governed by the general formula:

$$\sin \theta_n = n\lambda/d$$

where n=0,1,2 . . . (the order of diffracted light).

From this formula it is evident that first order diffracted light will only be present if $$d > \lambda \text{ (corresponding to } \sin \theta < 1)$$

Accordingly, with the known system of FIG. 1 the smallest period which can theoretically be recorded is equal to the wavelength $\lambda$ of the light used.

Figure 2:
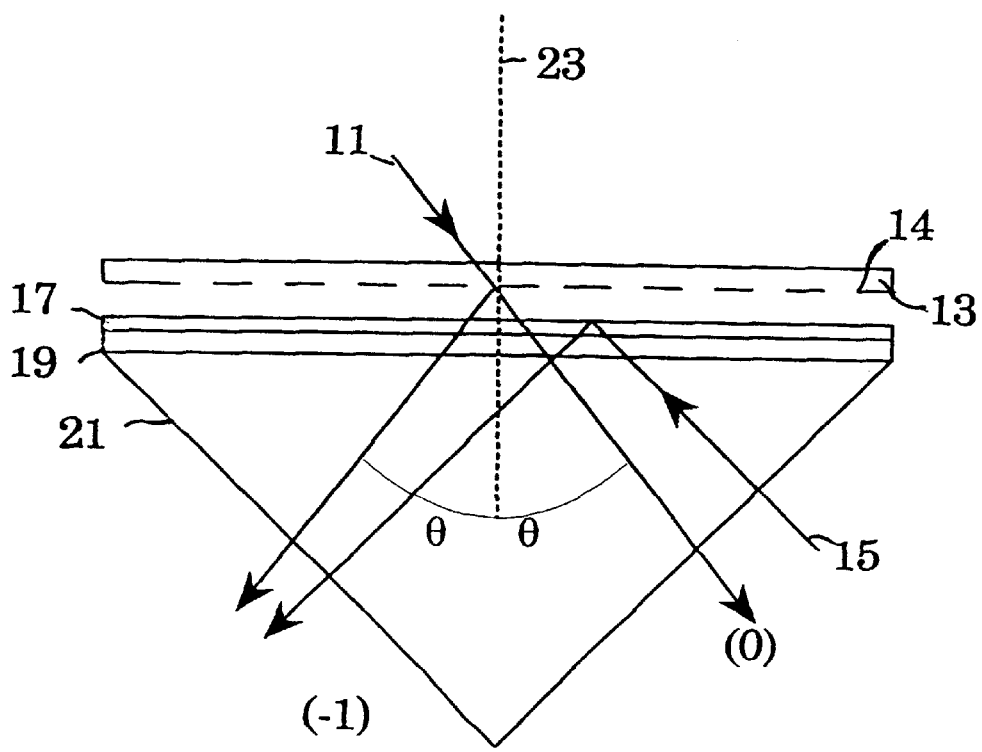
FIG. 2 illustrates hologram recording in a hologram recording system according to the invention with an off-axis object beam.

FIG. 2 illustrates a novel arrangement, particularly useful for recording periodic or quasi-periodic features. In contrast to the known holographic recording system of FIG. 1 the object beam 11 is arranged such that it illuminates the mask pattern at an angle $\theta$ with respect to the normal 23 to the substrate planes and such that the plane of incidence of the beam 11 contains the direction of periodicity of the grating pattern 14. In the preferred embodiment the angle of incidence $\theta$ of the object beam 11 is arranged such that the first diffraction order (−1) and the zero order (undiffracted light) are symmetrically disposed either side of the normal 23 to the mask plane, i.e. the normal 23 bisects the directions of the zero and first diffraction orders. With this arrangement the angle of incidence is related to the wavelength and the period of the mask pattern by $$\sin \theta = \lambda/2d$$

Accordingly, the theoretical limit of the smallest period which can be recorded is $$d_{min} = \lambda/2$$

i.e. half that of the apparatus of U.S. Pat. No. 4,857,425.

If the period of the pattern is too large (d>3$\lambda$/2), more than two orders will propagate and be recorded in the hologram. In this case the image reconstructed from the hologram will have an inferior depth of focus, reducing the effectiveness of this technique.

Thus, in practice the period of the features to be recorded should be in the following range:

$$\lambda/2 < d < 3\lambda/2$$

In the above range the new method and apparatus exhibits higher resolution for recording periodic structures.

It is to be noted that, if there are only two propagating orders of light, the depth of focus of the image at reconstruction becomes infinite for an infinite grating structure. For finite patterns the depth of focus of the reconstructed image will be a maximum in the middle and will decrease towards the edges of the image. Nonetheless, by proper choice of the various parameters (size of the mask pattern, wavelength, angle of incidence of the light beams and resolution of the features to be printed) the specification on the reconstruction apparatus can be relaxed resulting in much lower investment costs and a simpler manufacture procedure.

Figure 3:
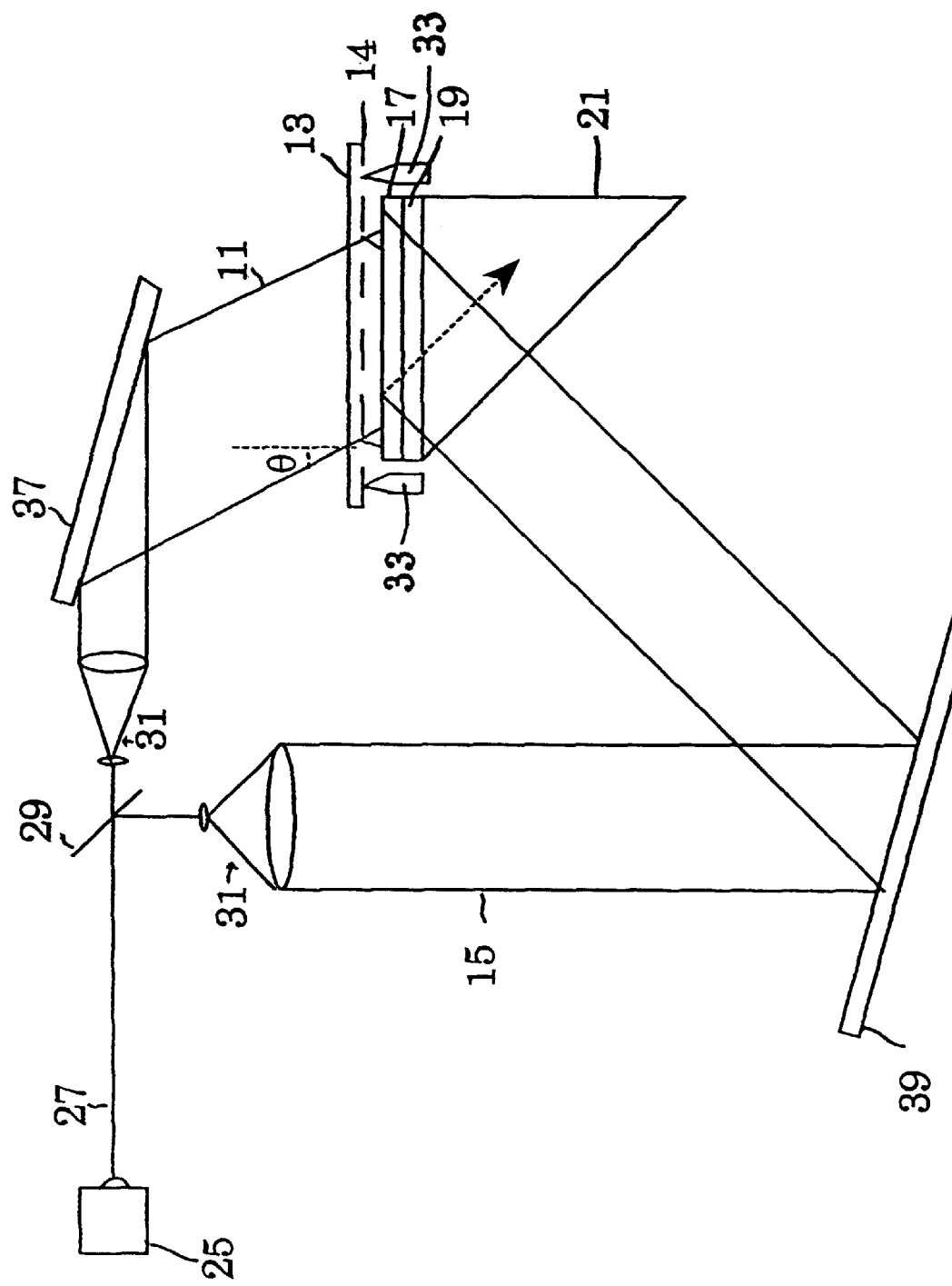
FIG. 3 shows schematically an apparatus for performing the invention.

For recording a substantially periodic pattern the hologram recording system of FIG. 3 may be used. The main difference with respect to known hologram recording systems is that the object beam is directed towards the plane of the mask at an angle $\theta$ to the normal to the mask substrate plane such that the plane of incidence of the object beam 11 contains the direction of periodicity of the periodic pattern 14. The recording system comprises a light source 25, usually a laser source, whose emitting light beam 27 is split by a beam splitter 29 into an object beam 11 and a reference beam 15. The beams 11,15 are both expanded by an appropriate expansion optics 31. The expansion optics usually comprises an expansion lens and a collimating lens. By these means well collimated light beams 11 and 15 are formed. It is to be noted that the light beam 27 may alternatively be expanded before the beam splitter 29 so that just one expansion optics 31 is needed.

The object beam 11 is directed by a mirror 37 to the mask substrate 13 so that it illuminates the mask pattern 14 at an off-axis angle $\theta$. The reference beam 15 is deflected by mirror 39 so that it is directed through the hypotenuse face of the prism 21 to the holographic recording layer 17 at an angle of approximately 45° such that the beam is totally internally reflected off the recording layer/air interface. The mask pattern 14 is arranged parallel and at a distance s above the recording layer 17 using piezoelectric transducers 33.

FIG. 4a illustrates schematically the difference in the patterns 41 printed from holograms 43 where during hologram recording the zero and first diffraction orders were symmetrical to the normal to the holographic layer bearing prism face (FIG. 4a) and asymmetric thereto (FIG. 4b).

Upon illumination of the hologram 43 by a reconstruction beam 45 a positive image of a mask pattern is reconstructed in the photosensitive layer 49 on a substrate 51 to form a structure or pattern 41 after development. As can be seen from the schematic drawing FIG. 4a the two reconstructed diffraction orders emanating from the hologram 43 are essentially symmetrical to the normal 23. Accordingly, the sidewalls of the three-dimensional structures 41 printed into the photosensitive layer 49 are essentially perpendicular to plane of substrate 51. FIG. 4b, in contrast, shows the structures 41' printed into the photosensitive layer 49' from a hologram 43' where during hologram recording the angle of incidence of the zero and first diffraction orders were different ($\phi_1$ and $\phi_2$, respectively). The printed structure 41' has substantially oblique sidewalls with respect to the substrate plane. For the manufacture of microelectronic devices this is undesirable.

FIG. 5 shows how how a hologram recording periodic structures in two different directions in the xy-plane can be manufactured from two masks, each having a periodic structure in one specific direction.

FIG. 6 illustrates the manufacture of a two-dimensional grating structure from a single mask having a periodic structure in one distinct direction. After a first holographic recording the mask pattern 13 and the object beam are rotated by 90° and then a second hologram is recorded so that a two-dimensional grating structure is produced.

A possible prism shape which allows the use of more than one set of object and reference beam is shown in FIG. 7. The prism 21' has two beam entry faces 53 (just one is shown in the cross sectional view), each for one reference beam. The prism can be used for the simultaneous recording of features in two different directions.

The hologram recording of a substantially periodic pattern can be conducted as follows: First a substrate 19 coated with an appropriate holographic recording layer 17 is arranged on one of the prism faces. A fluid with the same refractive index as the prism and the substrate material is applied between the substrate 19 and the prism 21 so that the reference beam 15 can pass from the prism 21 to the substrate 19 without being reflected. A second substrate 13 containing a mask pattern 14 is then arranged parallel and in proximity to the first substrate 19. The mask pattern 14 of the second substrate 13 can be produced by any of the known lithographic methods e.g. electron beam lithography.

For hologram recording a light beam, preferably from a laser source, is split by a beam splitter 29 into an object beam 11 and a reference beam 15. The beams 11,15 are expanded and collimated by one or more expansion optics 31 in a known manner.

The reference beam 15 is directed through one of the prism faces such that it is totally reflected from the holographic recording layer/air interface of the substrate. The object beam 11 is directed to the first substrate 19 at an off-axis angle. The object beam passing the mask pattern 13 is thereby diffracted. The angle of incidence is chosen according to the wavelength of the light used and the prevailing period in the mask pattern 14.

During illumination the object and reference beams 11,15 interfere with each other in the photosensitive layer 17 thereby forming a hologram of the mask pattern 14. Thereafter the first substrate 19 may be rotated or replaced by another substrate having a second mask pattern of a same or different period and a second illumination can take place. After all the illumination steps have been completed the holographic layer 17 is fixed.

To reconstruct a hologram 43, the hologram substrate 19 is again contacted to the prism face and the substrate containing the mask pattern is replaced by a substrate 51 coated with a photosensitive layer 49 (FIG. 4a). A reconstruction light beam 45 is directed through one of the prism faces in exactly the reverse direction to the reference beam direction. Light diffracted by the hologram thereby reconstructs a positive image of the mask pattern in the photosensitive layer 49.

The above described method and apparatus for performing the method is particularly useful for forming holograms from substantially periodic or quasi-periodic mask patterns.

What is claimed is:

1. Method of holographically recording periodic or quasi-periodic features of a mask pattern in a holographic recording layer comprising:

optically contacting a first substrate bearing a holographic recording layer to one face of a prism;

disposing a second substrate bearing a first mask pattern parallel and in proximity to the first substrate, the mask pattern containing periodic or quasi-periodic features in a first direction;

splitting and expanding or vice versa a light beam of a certain wavelength to generate an object beam and a reference beam;

directing the reference beam to one of the remaining prism faces such that the reference light beam is totally internally reflected off the holographic recording layer/air interface; and directing the object beam to the second substrate such that the object beam passes the mask pattern and interferes with the reference beam in the holographic recording layer to form a hologram of the mask pattern, wherein the object beam is directed to the second substrate at an off-axis angle of incidence related to the wavelength of the object beam and the period of the features to be recorded such that essentially just the zero and one of the first diffraction orders are present for forming the hologram.

2. Method according to claim 1, wherein the object beam is directed to the second substrate at an angle such that the normal to the plane of the second substrate essentially bisects the directions of the zero and first diffraction orders.

3. Method according to claim 1, wherein the plane of incidence of the object beam on the second substrate or mask contains the direction of the periodic features.

4. Method according to claim 1, comprising the additional steps of:

rotating the second substrate with respect to the first substrate;

rotating the object beam such that the plane of incidence of the object beam again contains the direction of the periodic features; and recording the mask pattern of the second substrate in the holographic recording layer a second time.

5. Method according to claim 1, comprising:

replacing the second substrate after recording the same by another substrate or mask pattern containing periodic or quasi-periodic features in a second direction;

rotating or arranging the object beam such that the plane of incidence of the object beam contains the periodic features of the second direction; and recording said second features in the holographic recording layer.

6. Method according to claim 4, including the steps of repeating the steps of:

rotating the second substrate with respect to the first substrate;

rotating the object beam such that the plane of incidence of the object beam again contains the direction of the periodic features; and recording the mask pattern of the second substrate in the holographic recording layer a second time.

7. Method according to claim 1, wherein the same or different mask patterns are recorded in two or more different holographic recording layers on two or more different first substrates for forming two or more holograms.

8. Method according to claim 1, wherein a second substrate containing a mask pattern having periodic or quasi-periodic features in at least two essentially different directions is used and wherein the mask patterns are recorded in the holographic recording layer by:

simultaneously illuminating the periodic features with at least two sets of object and reference beams, each set of object and reference beams emanating from a separate light source, where the object beams are at off-axis angles such that essentially lust the zero and one of the first diffraction order are generated by the respective periodic features to be recorded in the hologram; and first illuminating the periodic features in the first direction with first object and reference beams where the object beam is at an off-axis angle such that essentially lust the zero and one of the first diffraction order are generated by the respective periodic features to be recorded in the hologram; and then illuminating the periodic features of the second direction with second object and reference beams where the object beam is at an off-axis angle such that essentially lust the zero and one of the first diffraction order are generated by the second periodic features.

9. Method according to claim 1, wherein the direction of reference beam is in the plane of the object beam.

10. Method according to claim 1, wherein the wavelength of the light beam used is in the following range:

$$\lambda/2 < d < 3\lambda/2.$$

11. Method according to claim 1, wherein after development and fixation of the holographic layer the hologram is again contacted with the prism face and then reconstructed by replacing the substrate bearing the mask pattern by another substrate having a photosensitive layer and directing the reference beam—with respect to the beam direction in the hologram recording step—in the reversed direction through the prism.

12. Total Internal Reflection (TIR) hologram recording system for lithographic purposes, in particular for recording periodic or quasi-periodic features of a mask pattern in a holographic recording layer, comprising:

a prism a first substrate bearing a holographic recording layer and being optically contacted to one of the prism faces;

a second substrate being disposed parallel and in proximity to the first substrate, the second substrate bearing a mask pattern containing periodic or quasi-periodic features in a first direction;

at least one light source emitting light with a certain wavelength;

a beam splitting and expansion optics for generating;

an object beam and a reference beam;

means for directing the reference beam to one of the remaining prism faces such that the reference beam is totally reflected off the holographic recording layer/air interface; and means for directing the object beam to the second substrate such that it passes the mask pattern and interferes with the reference beam in the holographic recording layer to form a hologram of the mask pattern wherein the object beam directing means are arranged such that the object beam is directed to the second substrate at an off-axis angle of incidence related to the wavelength of the object beam and the period of the features to be recorded such that essentially lust the zero and one of the first diffraction orders are present for forming the hologram.

13. System according to claim 12, wherein the direction of the object beam with respect to the second substrate is at an angle such that the normal to the plane of the second substrate essentially bisects the directions of the zero and first diffraction orders.

14. System according to claim 12, wherein means are provided for varying the angle of incidence of the object beam.

15. System according to claim 12, further comprising:

second light source and means for generating second object and second reference beams independent of the first object and first reference beams; and a prism allowing directing the first and the second reference beams to the first substrate at such an angle that the reference beams are reflected off the holographic recording layer/air interface.

16. Use of the method according to claim 1, for manufacturing a DFB-laser.

* * * * *